US008632239B2

(12) United States Patent
Hsiao et al.

(10) Patent No.: US 8,632,239 B2
(45) Date of Patent: Jan. 21, 2014

(54) BACKLIGHT SYSTEM AND MANUFACTURING METHOD THEREOF

(75) Inventors: Yu-Chun Hsiao, Shenzhen (CN); Cheng-Wen Que, Shenzhen (CN); Yi-Cheng Kuo, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 88 days.

(21) Appl. No.: 13/380,827

(22) PCT Filed: Nov. 22, 2011

(86) PCT No.: PCT/CN2011/082644
§ 371 (c)(1), (2), (4) Date: Dec. 24, 2011

(87) PCT Pub. No.: WO2013/071530
PCT Pub. Date: May 23, 2013

(65) Prior Publication Data
US 2013/0128422 A1 May 23, 2013

(30) Foreign Application Priority Data
Nov. 18, 2011 (CN) .......................... 2011 1 0366127

(51) Int. Cl.
*F21V 21/00* (2006.01)
(52) U.S. Cl.
USPC ............................. 362/633; 362/97.1; 349/58
(58) Field of Classification Search
USPC .................... 362/633, 634, 632, 97.1; 349/58
See application file for complete search history.

(56) References Cited

U.S. PATENT DOCUMENTS

| | | | | |
|---|---|---|---|---|
| 7,116,386 B2 * | 10/2006 | Lee et al. | ......................... | 349/58 |
| 7,178,951 B1 * | 2/2007 | Hsiao et al. | ................... | 362/362 |
| 7,665,879 B2 * | 2/2010 | Hsieh | .............................. | 362/633 |
| 8,016,476 B2 * | 9/2011 | Chen et al. | ..................... | 362/631 |
| 8,199,276 B2 * | 6/2012 | Lee et al. | ......................... | 349/58 |
| 8,469,582 B2 * | 6/2013 | Kuo et al. | ..................... | 362/633 |
| 8,485,679 B2 * | 7/2013 | Li et al. | ........................ | 362/97.3 |
| 8,485,712 B2 * | 7/2013 | Huang et al. | .................. | 362/633 |
| 2008/0151502 A1 * | 6/2008 | Shives et al. | ................... | 361/704 |

FOREIGN PATENT DOCUMENTS

| | | |
|---|---|---|
| CN | 101109862 A | 1/2008 |
| CN | 101176901 A | 5/2008 |
| CN | 201266283 Y | 7/2009 |
| CN | 201331644 Y | 10/2009 |
| CN | 201672468 U | 12/2010 |

(Continued)

*Primary Examiner* — Peggy A. Neils
(74) *Attorney, Agent, or Firm* — Cheng-Ju Chiang

(57) ABSTRACT

The present invention provides a backlight system of flat panel display device, which includes a back frame and a circuit board; the back frame includes primary assembling pieces and secondary assembling pieces; the primary assembling pieces are of a number of at least two, the at least two primary assembling pieces being connected through joining; the secondary assembling pieces are arranged inside the back frame and joined to the back frame; and the circuit board is releasably mounted to the back frame. The present invention also provides a method for manufacturing a backlight system of flat panel display device. Through above arrangement, the back frame mold is made simple in structure and the expenditure of the back frame mold is reduced, and the material used for back frame is saved so as to lower down the manufacturing cost of flat panel display device and also simplify removal and mounting of a circuit board.

13 Claims, 13 Drawing Sheets

(56) References Cited

FOREIGN PATENT DOCUMENTS

| CN | 201757332 | U | 3/2011 |
| CN | 202349766 | U | 7/2012 |
| DE | 10202048 | A1 | 7/2003 |

* cited by examiner

BACKLIGHT SYSTEM AND MANUFACTURING METHOD THEREOF

BACKGROUND OF THE INVENTION

1. Field of the Invention

The present invention relates to the field of displaying techniques, and in particular to a backlight system and a manufacturing method thereof.

2. The Related Arts

The state-of-the-art liquid crystal display device comprises a front bezel, a panel, and a backlight module, of which the backlight module comprises a back frame, a reflector plate, a light guide, and a lighting assembly.

Currently, a variety of display panels of different sizes are available in the market to meet different needs of general consumers. For example, in the field of television set, the sizes of liquid crystal panels include 31.5, 42, 46, 48, and 55 inches. Different back frame molds are provided for liquid crystal planes of different sizes.

Referring to FIG. 1, FIG. 1 is a schematic view showing a conventional back frame of liquid crystal display device. As shown in FIG. 1, the conventional back frame 10 is a unitary back frame, and it is often that a unitary back frame 10 is made with metal stamping or plastic injection molding. The unitary back frame 10 consumes much material and has a high material cost. Further, a large-sized back frame 10 requires large-sized stamping equipment, and the size of mold corresponding to such a back frame 10 is large and the structure complicated, making the expenditure of the back frame mold high. As a consequence, the conventional back frame is of a high cost.

SUMMARY OF THE INVENTION

The technical issue to be addressed by the present invention is to provide a backlight system and a manufacturing method thereof, which help lowering the material cost and mold cost and facilitate removal and mounting of a circuit board.

To address the above technical issue, the present invention adopts a technical solution that provides a backlight system of flat panel display device, which comprises a back frame and a circuit board; the back frame comprises primary assembling pieces and secondary assembling pieces; the primary assembling pieces are of a number of at least two, the at least two primary assembling pieces being connected through joining; the secondary assembling pieces are arranged inside the back frame and joined to the back frame; and the circuit board is releasably mounted to the back frame.

Wherein, the backlight system comprises a rack mounted to the secondary assembling pieces, the primary assembling pieces, or a combination thereof, the circuit board being releasably mounted to the rack.

Wherein, the rack comprises an installation trough and retention pawls, the circuit board being received in the installation trough and releasably retained by the retention pawls.

Wherein, the rack comprises a first bridge and a second bridge, the first bridge and the second bridge being mounted, in parallel to each other, between the secondary assembling piece and the primary assembling piece, between the two primary assembling pieces or between the two secondary assembling pieces; each of the bridges has a side that is adjacent to the other bridge and is provided with two retention pawls projecting toward a front surface or a back surface of the back frame, each of the retention pawls comprising an extension arm extending from a side of the bridge and a hook formed by bending an end of the extension arm, four extension arms forming a trough wall structure of the installation trough, four hooks forming a support structure of bottom of the installation trough; four trough walls are provided at the same side with notches for engaging the circuit board, the circuit board having a side forming, at positions corresponding to the notches, projections for engaging the notches; and a spring plate is arranged one a trough wall opposite to the notches, the spring plate applying a force in a direction opposite to the notches to a corresponding edge of the circuit board.

Wherein, the spring plate projects from a side edge of one of the bridges and has an end forming a hook.

Wherein, the at least two primary assembling pieces comprise first and second primary assembling pieces that are joined to each other, in which the first primary assembling piece has an end having a surface forming at least two joint sections that are arranged to space from each other in a lengthwise direction of the first primary assembling piece, the first primary assembling piece using one of the joint sections to join a corresponding end of the second primary assembling piece.

Wherein, the joint sections comprise recesses formed in a surface of the first primary assembling piece and having a shape corresponding to the end of the second primary assembling piece for receiving the end of the second primary assembling piece.

Wherein, the recess of the first primary assembling piece forms in a bottom thereof a first through hole, the second primary assembling piece forming in a corresponding location a second through hole, the back frame comprising a fastener, the fastener extending through the first through hole and the second through hole to join the first primary assembling piece and the second primary assembling piece to each other.

Wherein, the joint sections comprise recesses formed in a surface of the first primary assembling piece, the second primary assembling piece having an end having a surface forming, at corresponding locations, protrusions that are arranged to space from each other in a lengthwise direction of the second primary assembling piece, the protrusions being receivable in the recesses to join the first primary assembling piece and the second primary assembling piece to each other.

Wherein, the back frame comprises a third primary assembling piece and a fourth primary assembling piece; and the first primary assembling piece, the second primary assembling piece, the third primary assembling piece, and the fourth primary assembling piece are straight linear and are joined to each other in a leading end-to-tailing end manner to form a rectangular main frame structure enclosing the back frame.

Wherein, the secondary assembling pieces comprise a first secondary assembling piece and a second secondary assembling piece, the first secondary assembling piece having two ends respectively joined to at least two primary assembling pieces of the first primary assembling piece, the second primary assembling piece, the third primary assembling piece, and the fourth primary assembling piece, the second secondary assembling piece having two ends respectively joined to at least two primary assembling pieces of the first primary assembling piece, the second primary assembling piece, the third primary assembling piece, and the fourth primary assembling piece.

Wherein, the two ends of the first secondary assembling piece are respectively joined to the first primary assembling piece and the second primary assembling piece that are adjacent to each other and the two ends of the second secondary assembling piece are respectively joined to the third primary assembling piece and the fourth primary assembling piece that are adjacent to each other; or the two ends of the first secondary assembling piece are respectively joined to the first primary assembling piece and the third primary assembling piece that are opposite to each other and the two ends of the second secondary assembling piece are respectively joined to the first primary assembling piece and the third primary assembling piece that are opposite to each other, and the second primary assembling piece, the fourth primary assembling piece, the first secondary assembling piece, and the second secondary assembling piece are arranged parallel to each other.

Wherein, the back frame comprises at least one bracing piece, which is releasably fixed to one or more of the first primary assembling piece, the second primary assembling piece, the third primary assembling piece, the fourth primary assembling piece, the first secondary assembling piece, and the second secondary assembling piece, the bracing piece forming a bump.

To address the above technical issue, the present invention adopts a technical solution that provides a method for making a backlight system of flat panel display device, which comprises manufacturing primary assembling pieces and secondary assembling pieces of a back frame, the primary assembling pieces having a number of at least two; joining at least two primary assembling pieces to form a main frame structure of the back frame; joining the secondary assembling pieces inside the main frame structure; and releasably mounting a circuit board to the back frame.

Wherein, the step of manufacturing primary assembling pieces of a back frame comprises: manufacturing at least first and second primary assembling pieces, in which the first primary assembling piece has an end forming at least two joint sections, each of the joint sections having a structure that mates a corresponding end of the second primary assembling piece; and the step of joining at least two primary assembling pieces to form a main frame structure of the back frame comprises: selecting one joint section of the at least two joint sections according to a size of the back frame to join the corresponding end of the second primary assembling piece.

Wherein, when an additional joint section is present between joining location of the second primary assembling piece and the end of the first primary assembling piece, before or after the step of selecting one joint section of the at least two joint sections according to a size of the back frame to join the corresponding end of the second primary assembling piece, the additional joint section of the first primary assembling piece that is located outward of the joining position of the second primary assembling piece is trimmed off.

The efficacy of the present invention is that to be distinguished from the state of the art, the present invention provides a backlight system and a manufacturing method thereof comprising at least two primary assembling pieces that form a main frame structure of a back frame and secondary assembling pieces are arranged inside the main frame structure and the circuit board is releasably mounted to the back frame. Through this arrangement, the back frame mold is made simple in structure and the expenditure of the back frame mold is reduced, and the material used for back frame is saved so as to lower down the manufacturing cost of flat panel display device.

DETAILED DESCRIPTION OF THE PREFERRED EMBODIMENTS

Figure 1:
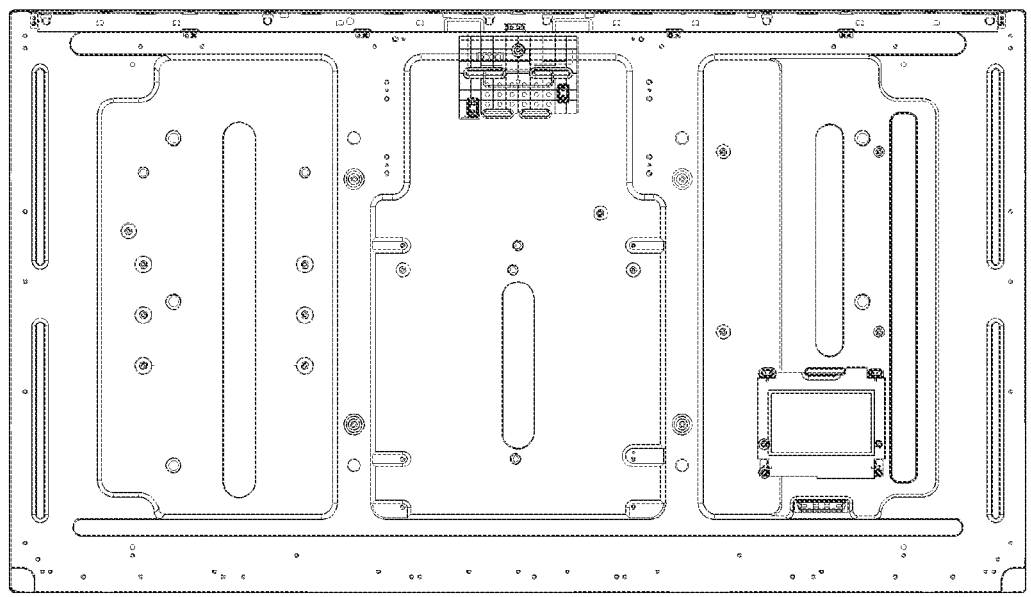
FIG. 1 is a schematic view showing a conventional back frame of liquid crystal display device.
Figure 2:
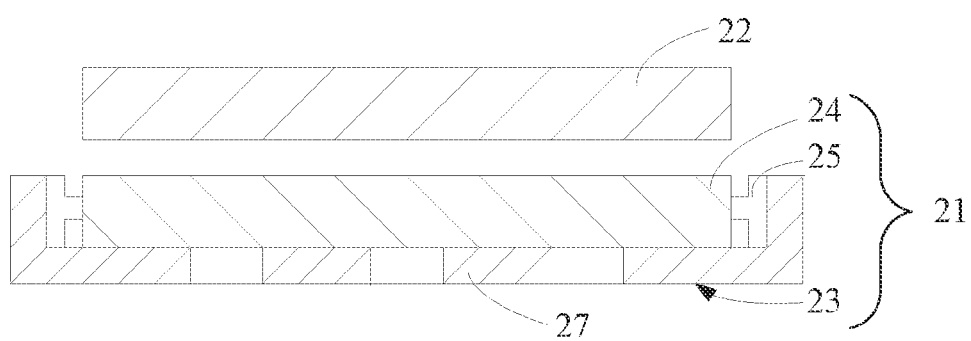
FIG. 2 is a schematic view showing a flat panel display device according to a first embodiment of the present invention.
Figure 3:
FIG. 3 is a schematic view showing a back frame of a flat panel display device according to a second embodiment of the present invention.

Referring to FIGS. 2-3, FIG. 2 is a schematic view showing a flat panel display device according to a first embodiment of the present invention and FIG. 3 is a schematic view showing a first embodiment of a back frame of a flat panel display device according to a second embodiment of the present invention. As shown in FIG. 2, the flat panel display device 20 according to the instant embodiment comprises: a backlight system 21 and a display panel 22. The backlight system 21 is arranged on a back side of the display panel 22 and supplies light to the display panel 22.

In the instant embodiment, the backlight system 21 comprises a light source 25, a light homogenization mechanism 24, and a back frame 23. The back frame 23 carries the light source 25 and the light homogenization mechanism 24. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the two of at least a first and second primary assembling pieces constitute a main frame structure 27 of the back frame 23.

Referring also to FIG. 3, the back frame 23 of the first embodiment comprises a first primary assembling piece 261 and a second primary assembling piece 262. The first primary assembling piece 261 has an end joined to an end of the second primary assembling piece 262, and the first primary assembling piece 261 has another end joined to another end of the second primary assembling piece 262 in order to form the main frame structure 27 of the back frame 23. The first primary assembling piece 261 and the second primary assembling piece 262 are both aluminum pieces or galvanized steel pieces. In the instant embodiment, the first primary assembling piece 261 and the second primary assembling piece 262 are L-shaped.

Figure 4:
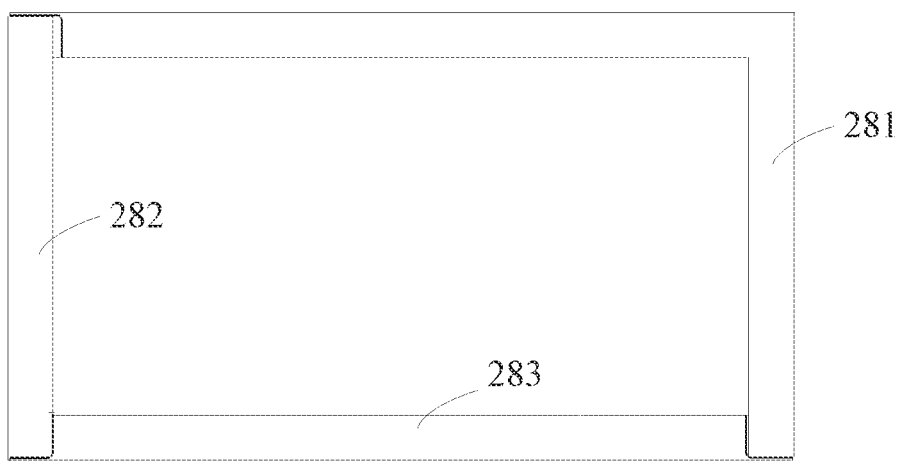
FIG. 4 is a schematic view showing a back frame of a flat panel display device according to a third embodiment of the present invention.

Referring also to FIG. 4, the back frame 23 of a second embodiment comprises a first primary assembling piece 281, a second primary assembling piece 282, and a third primary assembling piece 283. The three primary assembling pieces 281, 282, and 283 are assembled and joined to form a main frame structure 27 of the back frame 23. The three primary assembling pieces 281, 282, and 283 are all aluminum pieces or galvanized steel pieces. In the instant embodiment, the first primary assembling piece 281 is L-shaped, and the second and third primary assembling pieces 282, 283 are straight linear.

Further, the back frame 23 further comprises secondary assembling pieces arranged inside and joined to the main frame structure 27.

A detailed description will be given to the back frame 23 of the flat panel display device 20 according to the present invention, which comprises four primary assembling pieces and two secondary assembling pieces.

Figure 5:
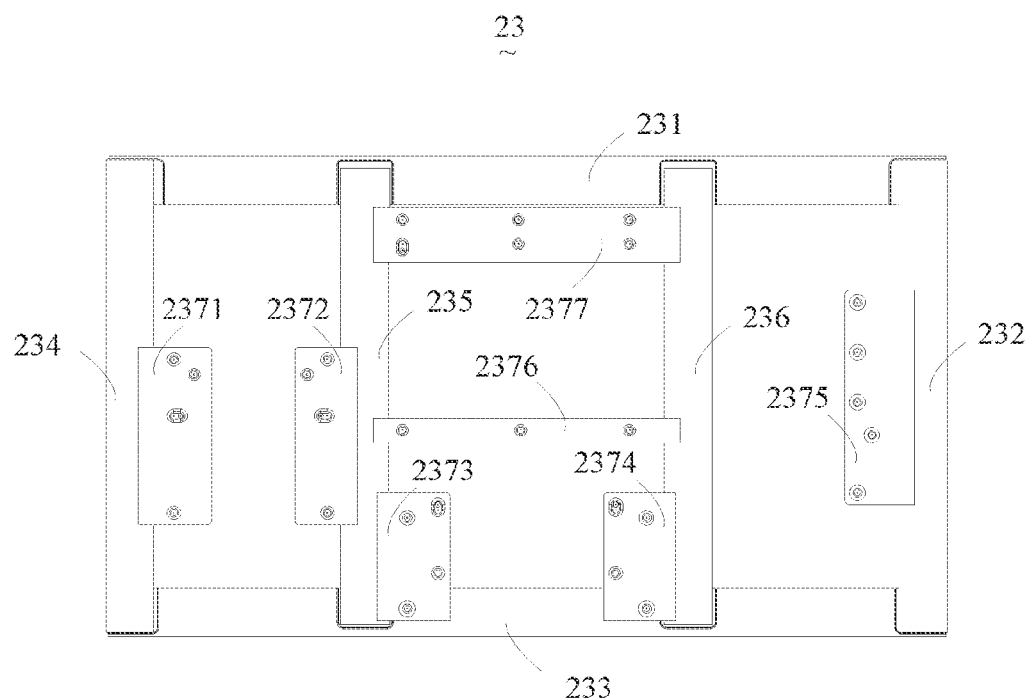
FIG. 5 is a schematic view showing a back frame of a flat panel display device according to a fourth embodiment of the present invention.

Referring to FIG. 5, FIG. 5 is a schematic view showing a back frame of flat panel display device according to a fourth embodiment of the present invention. As shown in FIG. 5, in the instant embodiment, a back frame 23 comprises: a first primary assembling piece 231, a second primary assembling piece 232, a third primary assembling piece 233, a fourth primary assembling piece 234, a first secondary assembling piece 235, a second secondary assembling piece 236, and bracing pieces 2371, 2372, 2373, 2374, 2375, 2376, and 2377. The first primary assembling piece 231, the second primary assembling piece 232, the third primary assembling piece 233, and the fourth primary assembling piece 234 are successively joined to each other in an end-to-end manner to constitute a rectangular main frame structure 27 of the back frame 23. The first secondary assembling piece 235 and the second secondary assembling piece 236, serving as ancillary assembling pieces, are arranged in the main frame structure 27 and joined to the main frame structure 27.

Specifically, an end of the first primary assembling piece 231 is joined to an end of the second primary assembling piece 232, another end of the second primary assembling piece 232 is joined to an end of the third primary assembling piece 233, another end of the third primary assembling piece 233 is joined to an end of the fourth primary assembling piece 234, and another end of the fourth primary assembling piece 234 is joined to another end of the first primary assembling piece 231 in order to form the rectangular main frame structure 27. The first primary assembling piece 231, the second primary assembling piece 232, the third primary assembling piece 233, and the fourth primary assembling piece 234 are all aluminum pieces or galvanized steel pieces. In the instant embodiment, the first primary assembling piece 231, the second primary assembling piece 232, the third primary assembling piece 233, and the fourth primary assembling piece 234 are straight linear, yet in other embodiments, it is apparent to those skilled in the art to make all the first primary assembling piece 231, the second primary assembling piece 232, the third primary assembling piece 233, and the fourth primary assembling piece 234 L-shaped, or some being straight linear and the remaining being L-shaped. For example, in FIG. 3, the first primary assembling piece 261 and the second primary assembling piece 262 are both L-shaped; in FIG. 4, the first primary assembling piece 281 is L-shaped, while the second and third primary assembling pieces 282 and 283 are straight linear.

Figure 6:
FIG. 6 is a schematic view showing a joining structure of a flat panel display device according to a fifth embodiment of the present invention.

In the instant embodiment, the back frame 23 of the flat panel display device 20 is formed by joining connection. As shown in FIG. 6, an illustrative example is given for the connection of an end of the first primary assembling piece 231 to an end of the second primary assembling piece 232, wherein the end of the second primary assembling piece 232 is joined to the end of the first primary assembling piece 231 by means of for example screwing, fastening, or welding, to have the end of the second primary assembling piece 232 connected to the end of the first primary assembling piece 231.

Figure 7:
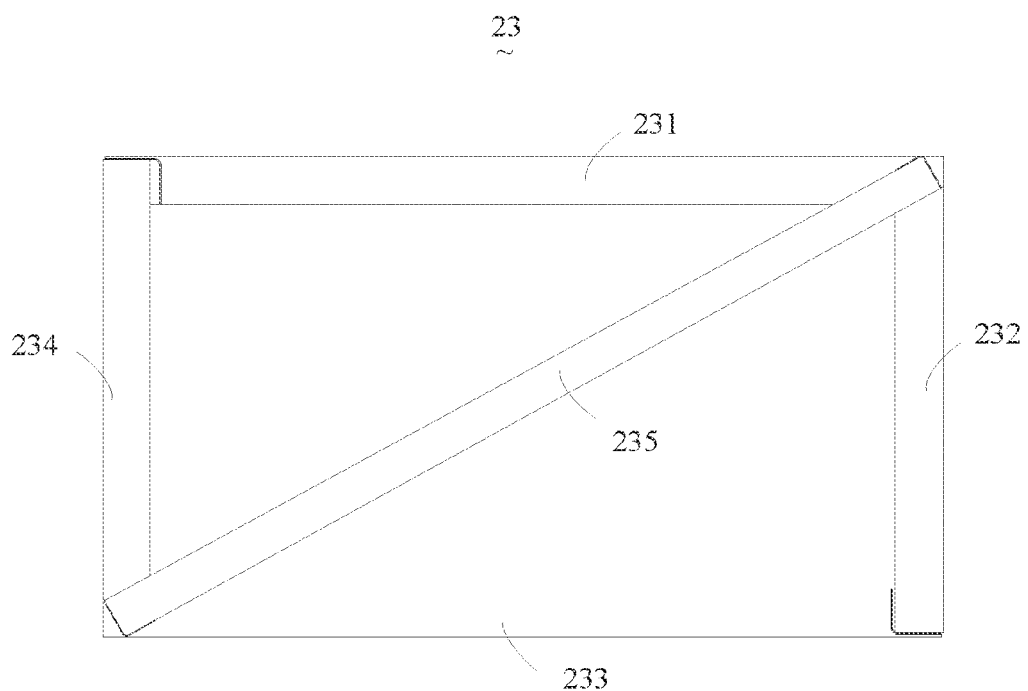
FIG. 7 is a schematic view showing a diagonally-arranged first secondary assembling piece mounted to a main frame structure of a flat panel display device according to a sixth embodiment of the present invention.
Figure 8:
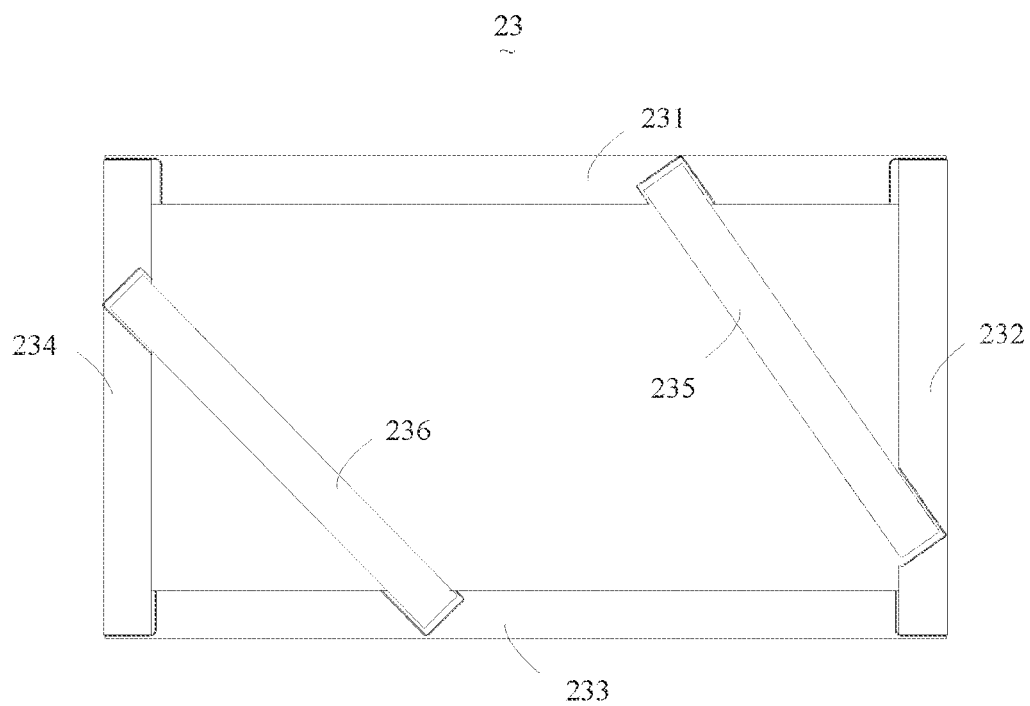
FIG. 8 is a schematic view showing a first secondary assembling piece and a second secondary assembling piece mounted to a main frame structure of a flat panel display device according to a seventh embodiment of the present invention.

In the instant embodiment, the first secondary assembling piece 235 and the second secondary assembling piece 236 are arranged in the main frame structure 27 of the back frame 23. An end of the first secondary assembling piece 235 is joined to the first primary assembling piece 231 and another end of the first secondary assembling piece 235 is joined to the third primary assembling piece 233; and an end of the second secondary assembling piece 236 is joined to the first primary assembling piece 231 and another end of the second secondary assembling piece 236 is joined to the third primary assembling piece 233. Further, the second primary assembling piece 232, the fourth primary assembling piece 234, the first secondary assembling piece 235, and the second secondary assembling piece 236 are arranged parallel to each other. In other embodiments, those skilled in the art may arrange at least one secondary assembling piece in the main frame structure 27. For example, only the first secondary assembling piece 235 is arranged in the main frame structure 27. Further, the two ends of the first secondary assembling piece 235 can be selectively joined to at least two of the primary assembling pieces of the first primary assembling piece 231, the second primary assembling piece 232, the third primary assembling piece 233, and the fourth primary assembling piece 234. For example, the first secondary assembling piece 235 is set diagonally in the main frame structure 27, as shown in FIG. 7. Similarly, the two ends of the second secondary assembling piece 236 can be selectively joined to at least two of the primary assembling pieces of the first primary assembling piece 231, the second primary assembling piece 232, the third primary assembling piece 233, and the fourth primary assembling piece 234. For example, the two ends of the first secondary assembling piece 235 are respectively joined to the first primary assembling piece 231 and the second primary assembling piece 232 that are adjacent to each other and the two ends of the second secondary assembling piece 236 are respectively joined the third primary assembling piece 233 and the fourth primary assembling piece 234 that are adjacent to each other, as shown in FIG. 8.

In the instant embodiment, the back frame 23 comprises seven bracing pieces 2371, 2372, 2373, 2374, 2375, 2376, and 2377. The bracing piece 2371 is fixed to the fourth primary assembling piece 234; the bracing pieces 2372, 2373 are both fixed to the first secondary assembling piece 235; the bracing piece 2374 is fixed to the second secondary assembling piece 236; the bracing piece 2375 is fixed to the second primary assembling piece 232; and the bracing pieces 2376, 2377 are each fixed, at two ends thereof, to the first secondary assembling piece 235 and the second secondary assembling piece 236. In practice, the bracing pieces can be fixed to one or more of the first primary assembling piece 231, the second primary assembling piece 232, the third primary assembling piece 233, the fourth primary assembling piece 234, the first secondary assembling piece 235, and the second secondary assembling piece 236. In other embodiments, those skilled in the art may mount bracing pieces of any other numbers to the back frame 23, such as one or more bracing pieces. Further, the bracing pieces can be releasably fixed to one or more of the first primary assembling piece 231, the second primary assembling piece 232, the third primary assembling piece 233, the fourth primary assembling piece 234, the first secondary assembling piece 235, and the second secondary assembling piece 236.

The bracing pieces 2371, 2372, 2373, 2374, 2375, 2376, and 2377 may be provided with bumps (not labeled) so that the back frame 23 may fix components, such as circuit boards, with such bumps.

Molds for making the back frame 23 will be described. In the instant embodiment, the first primary assembling piece 231 and the third primary assembling piece 233 are of the same size and shape so that they can be made by stamping with the same mold. The second primary assembling piece 232, the fourth primary assembling piece 234, the first secondary assembling piece 235, and the second secondary assembling piece 236 are of the same size and shape so that they can be made by stamping with the same mold, making it possible to share the mold. Thus, the back frame 23 of the present invention can be made by stamping with only two small-sized molds, and compared to the conventional back frame 10 that requires a large-sized mold, the molds for making the back frame 23 of the present invention are simple in structure and small in size and thus the cost of mold for the back frame 23 can be lowered. Further, compared to the whole back frame structure of the conventional back frame 10, the back frame 23 of the present invention can significantly save material used and thus reduce the manufacturing cost of the flat panel display device 20.

Figure 9:
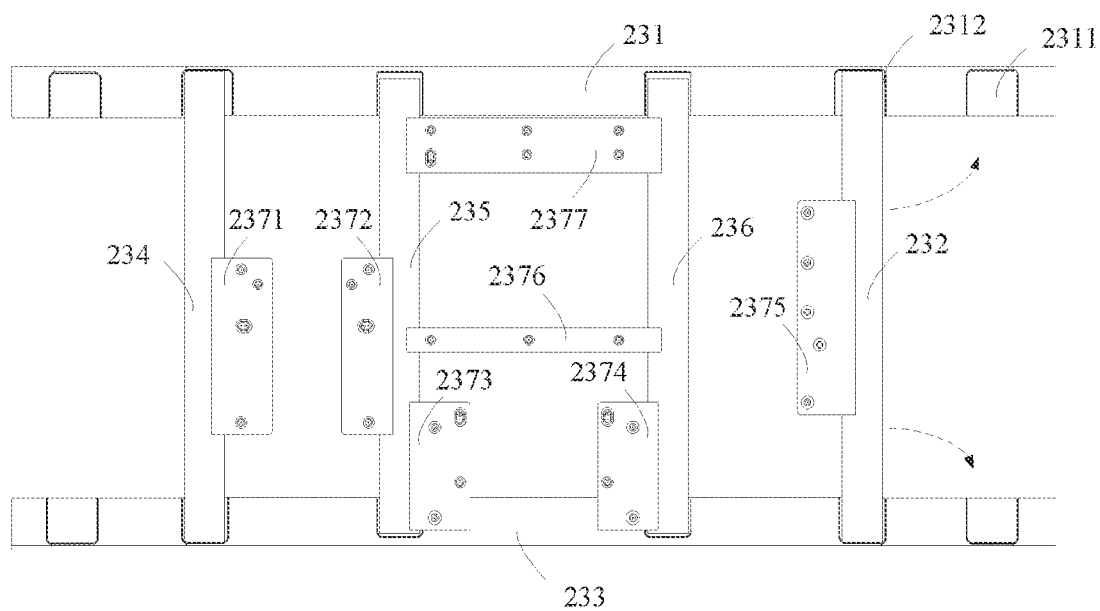
FIG. 9 is a schematic view showing joint sections of a back frame of a flat panel display device according to an eighth embodiment of the present invention.

Referring to FIG. 9, FIG. 9 is a schematic view showing joint sections of a back frame of a flat panel display device according to an eighth embodiment of the present invention. As shown in FIG. 9, in the instant embodiment, an end of the first primary assembling piece is provided with two joint sections, and the joint sections have a structure mating an end of the second primary assembling piece so that the first primary assembling piece can be joined to a corresponding end of the second primary assembling piece.

Figure 10:
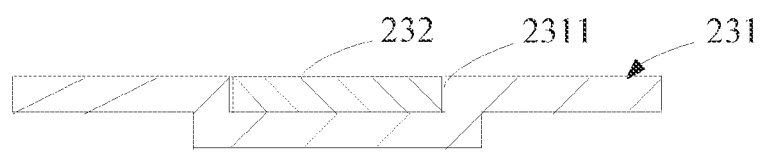
FIG. 10 is a cross-sectional view showing a first example of joint section of FIG. 9.

Specifically, the first primary assembling piece 231 has an end forming joint sections 2311, 2312, and the joint sections 2311, 2312 are arranged in a spaced manner in a lengthwise direction of the first primary assembling piece 231. The joint sections 2311, 2312 are formed by forming recesses having a shape mating an end of the second primary assembling piece 232 in the first primary assembling piece 231 in order to receive the end of the second primary assembling piece 232 therein. As shown in FIG. 10, the joint sections 2311, 2312 are recesses that do not extend through opposite surfaces of the end of the first primary assembling piece 231 and the recesses are of a rectangular shape with the second primary assembling piece 232 being straight linear.

Figure 11:
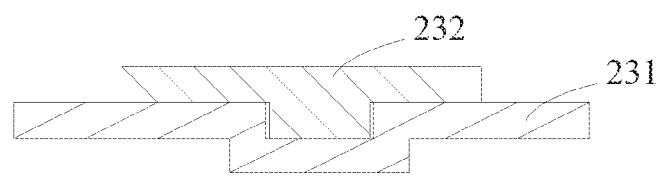
FIG. 11 is a schematic view showing a joining structure of a joint section of a back frame of a flat panel display device according to a ninth embodiment of the present invention.

To assemble a large-sized back frame 23, the joint section 2311 that is close to the very end of the first primary assembling piece 231 is first taken and a second primary assembling piece 232 having a corresponding width is selected. Afterwards, an end of the second primary assembling piece 232 is positioned in the recess of the joint section 2311. And then, means, such as screwing, fastening, or welding, is applied to join and fix the end of the second primary assembling piece 232 to the joint section 2311. To assemble a small-sized back frame 23, the joint section 2312 that is distant from the very end of the first primary assembling piece 231 is first chosen and a second primary assembling piece 232 having a corresponding width is selected. Afterwards, an end of the second primary assembling piece 232 is positioned in the recess of the joint section 2312. And then, means, such as screwing, fastening, or welding, is applied to join and fix the end of the second primary assembling piece 232 to the joint section 2312. Specifically, for example the second primary assembling piece 232 forms a protrusion at a corresponding location on a surface thereof, and the protrusion of the second primary assembling piece 232 is embedded in the recess the first primary assembling piece 231 at a corresponding location in order to join the first primary assembling piece 231 and the second primary assembling piece 232, as shown in FIG. 11. Further, the second primary assembling piece 232 may form, on one end thereof, at least two protrusions that are spaced in the lengthwise direction of the second primary assembling piece 232, such as two, three, or four protrusions.

Figure 12:
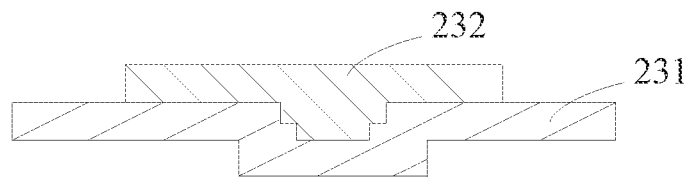
FIG. 12 is a schematic view showing a joining structure of a joint section of a back frame of a flat panel display device according to a tenth embodiment of the present invention.
Figure 13:
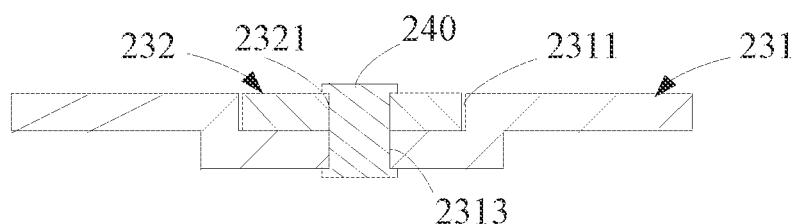
FIG. 13 is a schematic view showing a joining structure of a joint section of a back frame of a flat panel display device according to an eleventh embodiment of the present invention.

Furthermore, the recess of the first primary assembling piece 231 can be a recess of a multi-stepped configuration and the second primary assembling piece 232 forms, at a corresponding location, a protrusion having a multi-stepped configuration corresponding to the recess, as shown in FIG. 12. Further, as shown in FIG. 13, taking the joint section 2311 as an example, the recess of the first primary assembling piece 231 forms, in a bottom thereof, a first through hole 2313, and the second primary assembling piece 232 forms, at a location corresponding to the joint section 2311, a second through hole 2321. The back frame 23 further comprises a fastener 240. The fastener 240 extends through the first through hole 2313 and the second through hole 2321 to joint the first primary assembling piece 231 and the second primary assembling piece 232 to each other.

Figure 14:
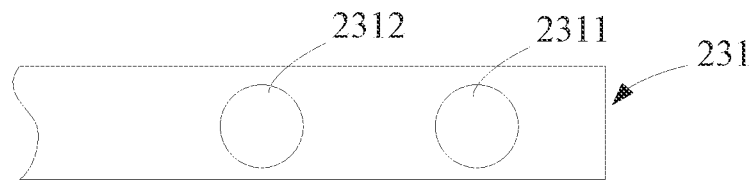
FIG. 14 is a schematic view showing a joint section of a back frame of a flat panel display device according to a twelfth embodiment of the present invention.

As shown in FIG. 14, in another embodiment of the back frame of flat panel display device according to the present invention, the recesses of the joint sections 2311, 2312 of the first primary assembling piece 231 are of a circular shape. Yet, in other embodiments, those skilled in the art may arrange the shape of the recesses to be other polygonal configurations, such as triangle.

Figure 15:
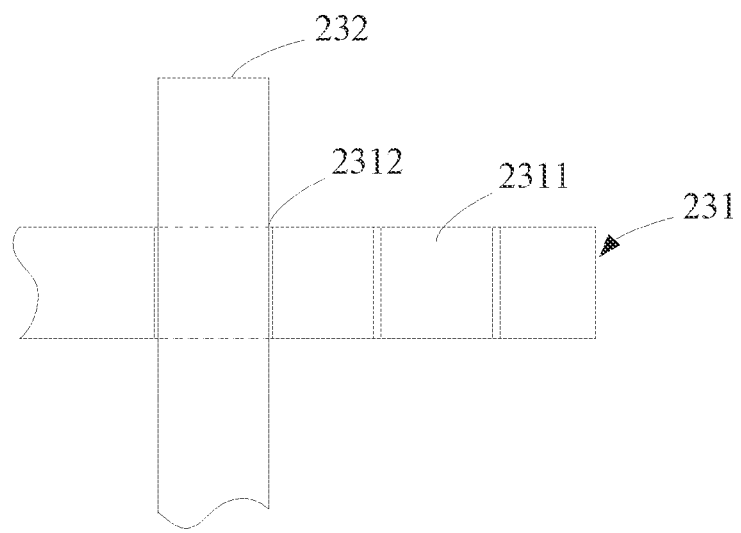
FIG. 15 is a schematic view showing a joint section of a back frame of a flat panel display device according to a thirteenth embodiment of the present invention.

As shown in FIG. 15, in another embodiment of the back frame of flat panel display device according to the present invention, the joint sections 2311, 2312 are recesses that do not extend through opposite surfaces of the first primary assembling piece 231, whereby an end of the second primary assembling piece 232 is movable within the joint sections 2311, 2312. For example, after the end of the second primary assembling piece 232 is set extending beyond and joined and fixed to the joint section 2312, the portion of extension is then trimmed off so that the length of the second primary assembling piece 232 that serves as a primary assembling piece of the back frame can be adjusted.

In the present invention, the other end of the first primary assembling piece 231 and both ends of the third primary assembling piece 233 are all provided with two joint sections having a structure identical to that of the joint sections 2311, 2312. In other words, the first primary assembling piece comprises at least two joint sections. Repeated description will be omitted here.

In summary, the present invention provides a back frame 23 having a first primary assembling piece that is provided with at least two joint sections. The number of the joint section can be selected according to the requirement of customers. In the instant embodiment, a description is given to an example comprising two joint sections 2311, 2312. Thus, to prepare the molds for making the back frame 23, only two sets of mold are needed, namely one mold for a first primary assembling piece and the other mold for a second primary assembling piece. The first primary assembling piece may be provided with a plurality of joint sections for joining operation in order to form various sizes for the back frame 23. To assemble the back frame 23, based on the desired size of the back frame 23, the corresponding one of the joint sections is selected. With the joint section, the second primary assembling piece is joined to the joint section of the first primary assembling piece and the other joint section of the first primary assembling piece that is located outward of the joining location of the second primary assembling piece is trimmed off to obtain a desired size of the back frame 23. Compared to the conventional technology that requires different back frame molds for making different sizes of back frame 10, the back frame of the flat panel display device 23 according to the present invention requires only a mold for the first primary assembling piece and a mold for the second primary assembling piece 28 so that mold sharing among various sizes of product can be realized and the molds used are of simple structures, allowing of reduction of expenditure of the molds for back frames.

The present invention also provides a mold for making a back frame of flat panel display device. The back frame mold is provided with a main pattern for forming a primary assembling piece of the back frame and the main pattern comprises a sub-pattern that forms at least two joint sections on an end of the primary assembling piece. The primary assembling piece comprises the previously discussed first primary assembling piece and second primary assembling piece, corresponding to the above mentioned main pattern; and the joint section comprises the previously discussed joint section of the first primary assembling piece, corresponding to the above mentioned sub-pattern. Repeated description is omitted herein.

Figure 16:
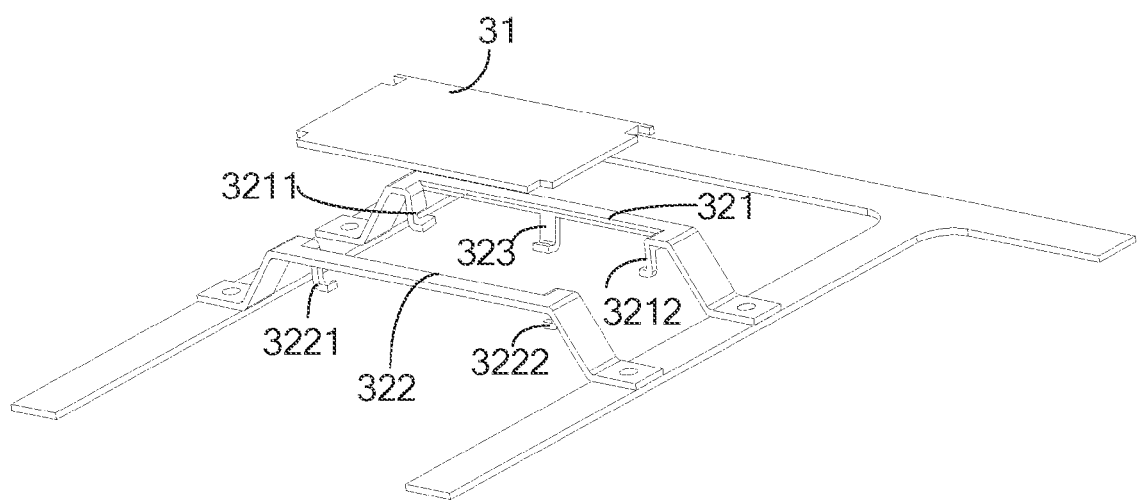
FIG. 16 is a schematic perspective view showing a circuit board and a rack of a flat panel display device according to a fourteenth embodiment of the present invention before being assembled.

Referring to FIG. 16, FIG. 16 is a schematic perspective view showing a circuit board and a rack of a flat panel display device according to a fourteenth embodiment of the present invention before being assembled. As shown in the drawing, the backlight system 21 further comprises a circuit board 31 and a rack 32 that releasably fixes the circuit board. The rack 32 comprises: a first bridge 321, a second bridge 322, a retention pawl 3211, a retention pawl 3212, a retention pawl 3221, a retention pawl 3222, and a spring plate 323. The circuit board 31 is releasably mounted to the rack 32. In the instant embodiment, the rack 32 forms an installation trough 37, and the circuit board 31 is received in the installation trough.

In the instant embodiment, the first bridge 321 and the second bridge 322 are mounted, in parallel to each other, between a secondary assembling piece and a primary assembling piece, between two primary assembling pieces, or between two secondary assembling pieces (not labeled). Intermediate portions of the first bridge 321 and the second bridge 322 are distant from the main frame structure and two ends are joined to the main frame structure. Each bridge has a side adjacent to another bridge and is provided with two retention pawls facing a front surface of the back frame, such as the retention pawl 3211, the retention pawl 3212, the retention pawl 3221, and the retention pawl 3222.

Figure 17:
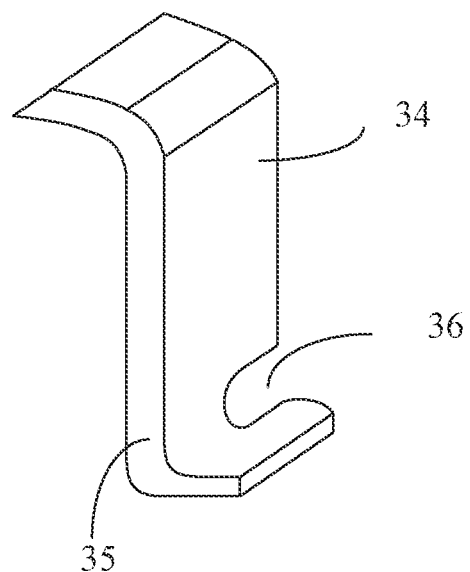
FIG. 17 is perspective view showing a first embodiment of a retention pawl of FIG. 16.

Also referring to FIG. 17, each retention pawl comprises an extension arm 34 extending from one side of the bridge, an hook 35 formed by bending an end of the extension arm 34, a notch 35 formed in the hook 35.

The notches of the retention pawl 3211, the retention pawl 3212, the retention pawl 3221, and the retention pawl 3222 are of the same direction and face the spring plate 323. The spring plate 323 projects from one side of a bridge and has an end forming a hook. The spring plate is an elastic material and is swingable in the direction of the notches. In other instant embodiments, the spring plate 323 is one or more in quantity. The extension arms of the four retention pawls form a trough wall structure of the installation trough 37 (not shown) and the hooks of the four retention pawls form a support structure on a bottom of the installation trough. To mount the circuit board 31, the notches of the hooks are first set in engagement with projections formed on a side edge of the circuit board 31 at positions corresponding to the notches, and at the same time, the spring plate 323 that is located at the trough wall opposite to the notches applies a force in a direction opposite to the notches to the corresponding side of the circuit board 31, whereby the notches of the hooks may engage recesses formed in the side edge of the circuit board 31 at positions corresponding to the notches.

To remove the circuit board 31, the circuit board 31 is pushed in a direction toward the spring plate 323 and after the projections of the circuit board 31 at the positions corresponding to the notches get off the notches of the retention pawl 3221 and the retention pawl 3222, the circuit board 31 can be withdrawn.

In a practical operation, as shown in the drawings, the projections on the side edge of the circuit board 31 at positions corresponding to the notches are set in engagement with the notches of the retention pawl 3222 and the retention pawl 3221 and recesses formed in the side edge of the circuit board 31 at locations corresponding to the notches engage the notches of the retention pawl 3211 and the retention pawl 3212. Meanwhile, the length of the circuit board 31 between two notches is equal to a distance between the retention pawl 3221 and the retention pawl 3222 and the distance between bottoms of the projections and the opposite side edge is equal to a perpendicular distance between the bottom of the notch of the retention pawl 3221 or the retention pawl 3222 and the plane on which the spring plate 323 is located. Further, the width of the bottom of the recess of the circuit board 31 is not less than the width of the retention pawl 3211 or the retention pawl 3212. When it needs to remove the circuit board 31, the circuit board 31 is pushed in a direction toward the spring plate 323 and after the projections of the circuit board 31 separate from the notches of the retention pawls, the circuit board 31 can be withdrawn.

Figure 18:
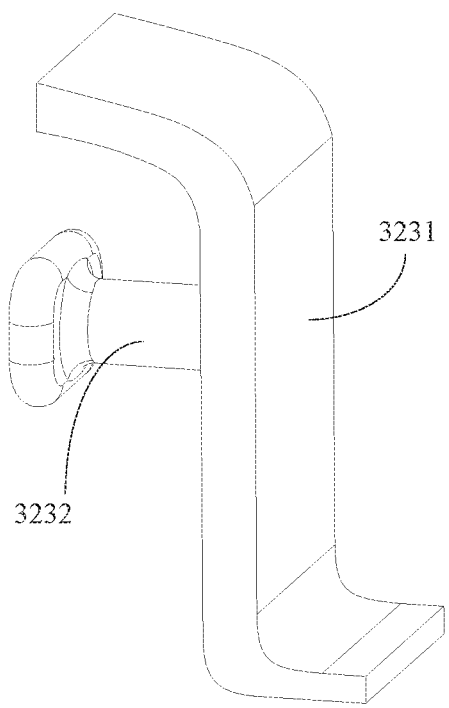
FIG. 18 is a perspective view showing a first embodiment of a spring plate.

As shown in FIG. 18, the spring plate comprises a stop plate 3231 and a handle 3232. Referring collectively to FIG. 16, the spring plate is rotatably coupled to the first bridge 321 and the spring plate is allowed to move forward and backward. In removing the circuit board, the stop plate 3231 is pulled backward through the handle 3232, and at the same time, the circuit board is pushed in a direction toward the stop plate. After the projections on the side edge of the circuit board at positions corresponding to the notches get off the notches of the retention pawl 3221 and the retention pawl 3222, the circuit board can be withdrawn.

Figure 19:
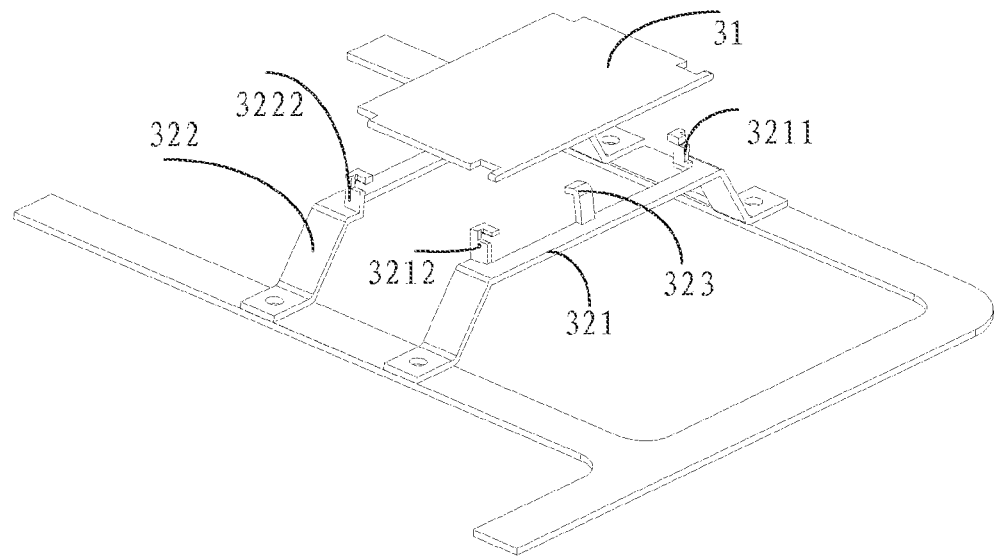
FIG. 19 is a schematic perspective view showing a circuit board and a rack of a flat panel display device according to a fifteenth embodiment of the present invention before being assembled.

As shown in FIG. 19, in an embodiment of rack for mounting and removing circuit board of a flat panel display device, the sides of the first bridge 321 and the second bridge 322 adjacent to each other form two retention pawls projecting toward the back surface of the back frame.

Figure 20:
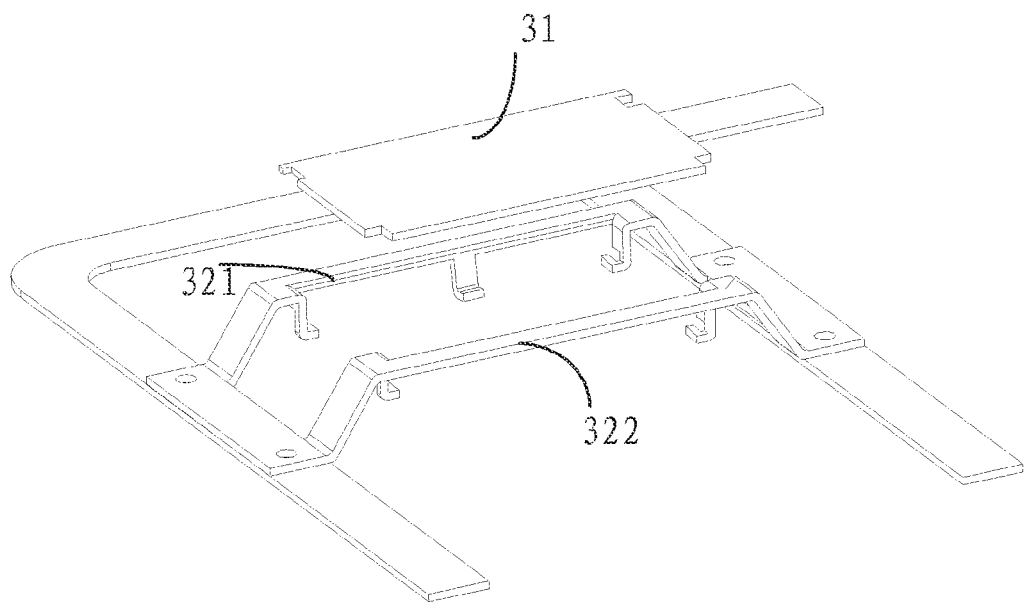
FIG. 20 is a schematic perspective view showing a circuit board and a rack of a flat panel display device according to a sixteenth embodiment of the present invention before being assembled.

As shown in FIG. 20, in an embodiment of rack for mounting and removing circuit board of a flat panel display device, the first bridge 321 and the second bridge 322 are a unitary structure.

Figure 21:
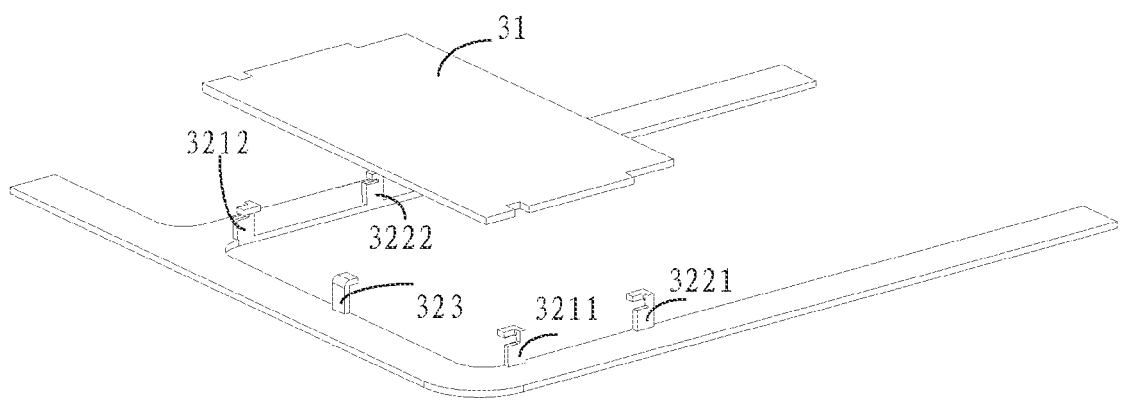
FIG. 21 is a schematic perspective view showing a circuit board and a rack of a flat panel display device according to a seventeenth embodiment of the present invention before being assembled.

As shown in FIG. 21, in an embodiment of rack for mounting and removing circuit board of a flat panel display device, the retention pawl 3211, the retention pawl 3212, the retention pawl 3221, the retention pawl 3222 are provided to project toward the back surface of the back frame and the four retention pawl are directly fixed to a secondary assembling piece, a primary assembling piece, or a combination thereof.

Figure 22:
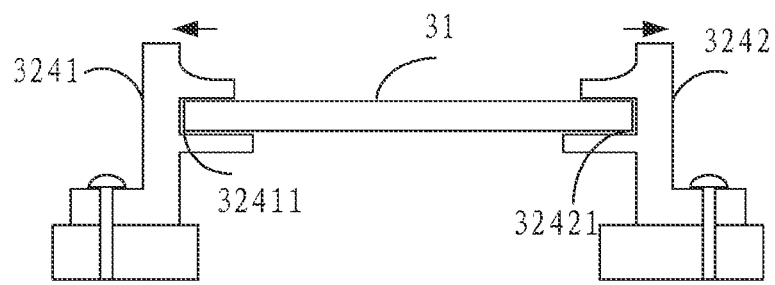
FIG. 22 is a schematic perspective view showing a circuit board and a rack of a flat panel display device according to an eighteenth embodiment of the present invention before being assembled.

As shown in FIG. 22, in an embodiment of rack for mounting and removing circuit board of a flat panel display device, the retention pawl 3241 and the retention pawl 3242 are provided to project toward back surface of the back frame. The retention pawl 3241 and the retention pawl 3242 have an upper portion that is F-shaped, forming a recess 32411 and a recess 32421 for retaining the circuit board. The recess 32411 and the recess 32421 are opposite to each other. The retention pawl 3241 and the retention pawl 3242 are mounted, in a spaced manner, to a secondary assembling piece, a primary assembling piece, or a combination thereof. The distance between the retention pawl 3241 and the retention pawl 3242 is equal to the length or width of the circuit board. The retention pawl 3241 and the retention pawl 3242 are elastic materials and are swingable in the directions of the recess 32411 and the recess 32421.

A practical operation can be to deflect the retention pawl 3241 and the retention pawl 3242 outwards as indicated by arrows of the drawing to allow one side of the circuit board 31 to be inserted into the recess 32411 and the other side into the recess 32421. Application of force is then stopped to complete retention of the circuit board 31. To remove the circuit board 31, again, as indicted by the arrows of the drawing, the retention pawl 3241 and the retention pawl 3242 are deflected outward to allow removal of the circuit board 31.

In other instant embodiments, bases of the retention pawl 3241 and the retention pawl 3242 may be fixed together by the rack.

In other instant embodiments, the recess 32411 and the recess 32421 are set in opposite directions and the lines on which the directions are set are parallel on the same horizontal surface.

Figure 23:
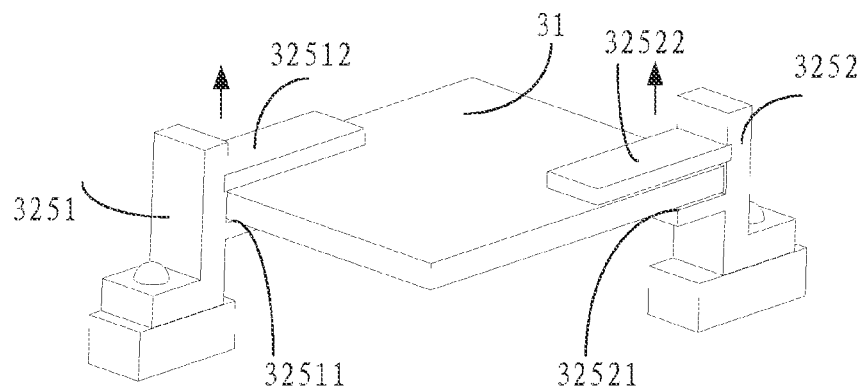
FIG. 23 is a perspective view showing the circuit board and the rack of FIG. 22 in an assembled condition.

As shown in FIG. 23, in an embodiment of rack for mounting and removing circuit board of a flat panel display device, the retention pawl 3251 and the retention pawl 3252 are provided to project toward the back surface of the back frame. The retention pawl 3251 and the retention pawl 3252 have upper portions that are F-shaped, forming a recess 32511 and a recess 32521 for retaining the circuit board. The recess 32511 and the recess 32521 are of opposite directions and the lines on which the directions are set are parallel on the same horizontal surface. Further, on the upper portions of the recesses, a hand stem 32512 and a hand stem 32522 are respectively joined in directions perpendicular to the retention pawls. The hand stem 32512 and the retention pawl 3251 are rotatably connected and, the hand stem 32522 and the retention pawl 3252 are rotatably connected, whereby the hand stem 32512 is movable up and down. The retention pawl 3251 and the retention pawl 3252 are mounted, in a spaced manner, to a secondary assembling piece, a primary assembling piece, or a combination thereof.

A practical operation can be to move the had stems as indicated by arrows of the drawing and when the hand stem 32512 and the hand stem 32522 are pulled upward, the circuit board 31 is inserted. Then the hand stem 32512 and the hand stem 32522 are tightly pressed down to fix the circuit board 31. To remove the circuit board 31, the hand stem 32512 and the hand stem 32522 are pulled upward to allow removal of the circuit board 31.

In other instant embodiments, bases of the retention pawl 3251 and the retention pawl 3252 may be fixed together by the rack.

Figure 24:
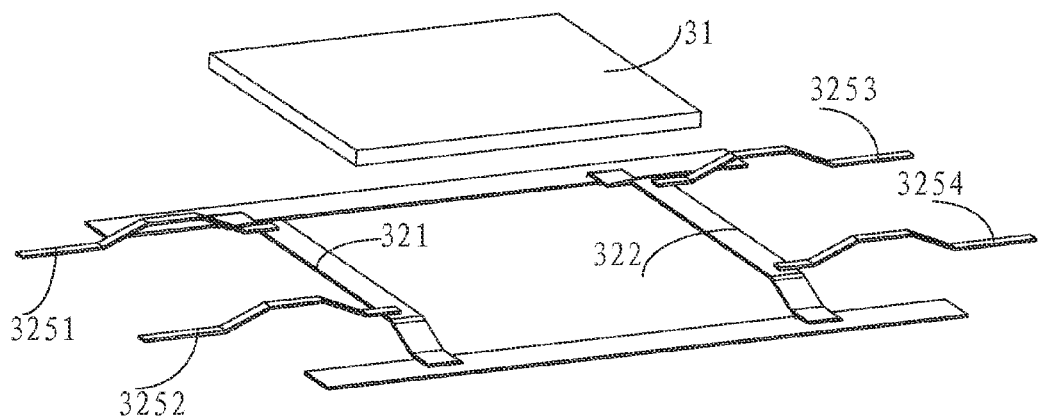
FIG. 24 is a schematic perspective view showing a circuit board and a rack of a flat panel display device according to a nineteenth embodiment of the present invention during assembling.

As shown in FIG. 24, in an embodiment of rack for mounting and removing circuit board of a flat panel display device, the main frame structure is provided with two bridges, and each bridge has a side that is distant from another bridge and is provided with two retention pawls projecting toward a front surface of the back frame. As shown in the drawing, the first bridge 321 is provided with a retention pawl 3251 and a retention pawl 3252, and the second bridge 322 is provided with a retention pawl 3253 a the retention pawl 3254. The retention pawls and the bridges are rotatably coupled and the retention pawls are rotatable about coupling points thereof with the bridges by 360 degrees.

In a practical operation, when it needs to fix a circuit board 31, the circuit board 31 is first positioned between the first bridge 321 and the second bridge 322 with opposite sides of the circuit board 31 respectively contacting the first bridge 321 and the second bridge 322. Then, the retention pawl 3251 and the retention pawl 3253 are rotated in directions of moving away from each other and similarly, the retention pawl 3252 and the retention pawl 3254 are rotated in directions of moving away from each other. The circuit board 31 is deposited and the retention pawl 3251 and the retention pawl 3253 are moved in directions of approaching each other and similarly, the retention pawl 3252 and the retention pawl 3254 are moved in directions of approaching each other to thereby fix the circuit board 31.

To remove the circuit board, the retention pawl 3251 and the retention pawl 3253 are rotated in directions of moving away from each other and similarly, the retention pawl 3252 and the retention pawl 3254 are rotated in directions of moving away from each other to allow of removal of the circuit board 31.

In summary, as shown in FIG. 16-24, with the arrangement of a rack that is of various configurations on a back frame, it is possible to easily mount and remove a circuit board and time is saved. Further, the rack can be mounted to a secondary assembling piece, a primary assembling piece, or a combination thereof.

Figure 25:
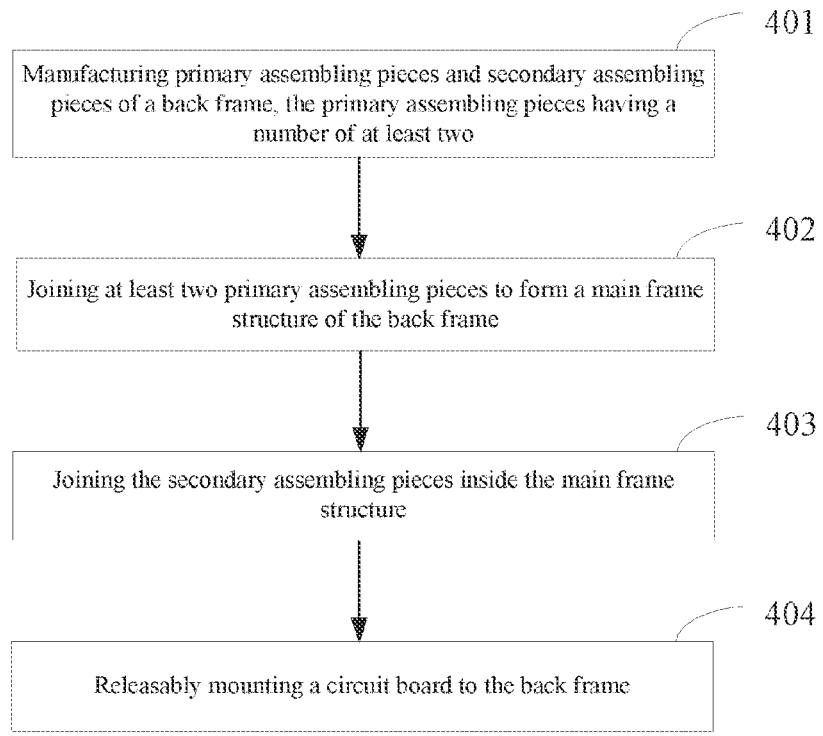
FIG. 25 is a flow chart showing a method for manufacturing a backlight system of a flat panel display device according to a twentieth embodiment of the present invention.

As shown in FIG. 25, the present invention also provides a method for making a backlight system of flat panel display device. The method comprises the following steps:

Step 401: manufacturing primary assembling pieces and secondary assembling pieces of a back frame, the primary assembling pieces having a number of at least two;

Step 402: joining at least two primary assembling pieces to form a main frame structure of the back frame;

Step 403: joining the secondary assembling pieces inside the main frame structure; and Step 404: releasably mounting a circuit board to the back frame.

The step of manufacturing primary assembling pieces of a back frame comprises manufacturing at least first and second primary assembling pieces, in which the first primary assembling piece has an end forming at least two joint sections, each of the joint sections having a structure that mates a corresponding end of the second primary assembling piece; and The step of joining at least two primary assembling pieces to form a main frame structure of the back frame comprises selecting one joint section of the at least two joint sections according to a size of the back frame to join the corresponding end of the second primary assembling piece.

In the instant embodiment, when other joint sections are present between the joining location of the second primary assembling piece and the end of the first primary assembling piece, before or after the step of selecting one joint section of the at least two joint sections according to a size of the back frame to join the corresponding end of the second primary assembling piece, the other joint sections of the first primary assembling piece that are located outward of the joining position of the second primary assembling piece are trimmed off. The first primary assembling piece comprises the previously discussed first primary assembling piece, and the second primary assembling piece comprises the previously discussed second primary assembling piece, and repeated description will be omitted herein.

Figure 26:
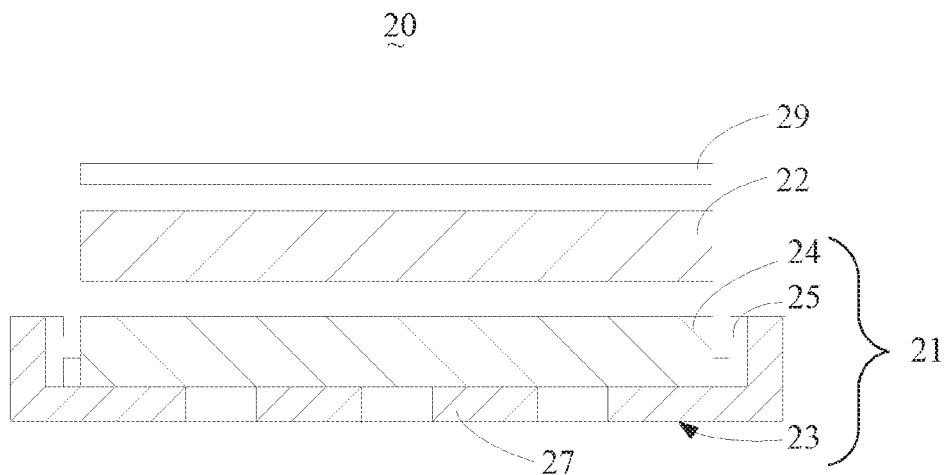
FIG. 26 is a schematic view showing a flat panel display device with a touch screen according to a twenty-first embodiment of the present invention.

As shown in FIG. 26, the flat panel display device 20 of the present invention further comprises a touch screen 29. The touch screen 29 is arranged on a light exit surface of the display panel 22 of the flat panel display device 20. The flat panel display device 20 comprises: the backlight system 21 and the above discussed display panel 22. The backlight system 21 is arranged at the back side of the display panel 22 and supplies light to the display panel 22.

The backlight system 21 comprises a light source 25, a light homogenization mechanism 24, and a back frame 23. The back frame 23 carries the light source 25 and the light homogenization mechanism 24. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the at least one first and second primary assembling pieces constitute a main frame structure 27 of the back frame 23.

It is noted that the flat panel display device 20 of the present invention can be a liquid crystal display device or a liquid crystal television.

Figure 27:
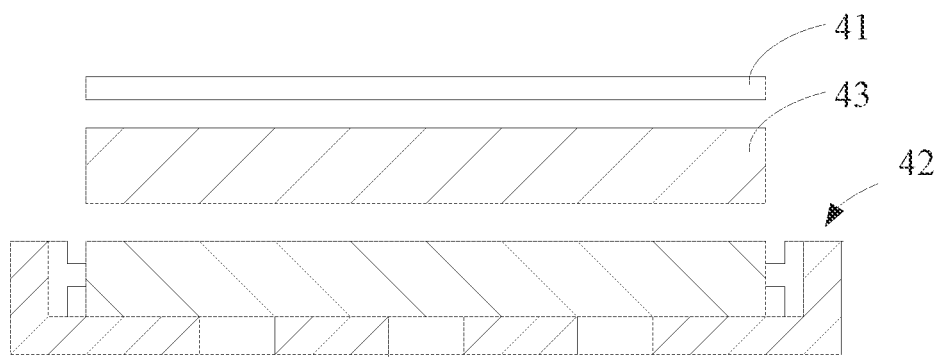
FIG. 27 is a schematic view showing a stereoscopic display device according to a twenty-second embodiment of the present invention.
Figure 28:
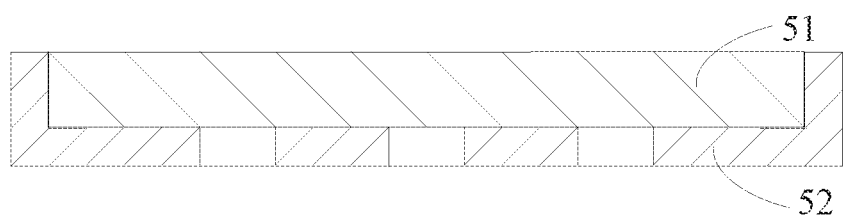
FIG. 28 is a schematic view showing a plasma display device according to a twenty-third embodiment of the present invention.

The present invention also provides a stereoscopic display device 30, as shown in FIG. 27. The stereoscopic display device 30 comprises a liquid crystal lens grating 41, a backlight system 42, and a display panel 43. The liquid crystal lens grating 41 is arranged on a light exit surface of the display panel 43. The backlight system 42 can be a backlight system of each of the above discussed embodiments, such as the backlight system 42 comprising the back frame 23. The back frame 23 comprises at least first primary assembling piece and the second primary assembling piece. The at least first and second primary assembling pieces form a main frame structure of the back frame. Repeated description will be omitted herein.

The present invention also provides a plasma display device 40, as shown in FIG. 19. The plasma display device 40 comprises a plasma display panel 51 and a back frame 52. The back frame 52 is arranged at a back side of the plasma display panel 51. The back frame 52 can be the back frame of each of the previously discussed embodiments and repeated description will be omitted herein.

With the above discussed manners, the present invention provides a flat panel display device, a stereoscopic display device, and a plasma display device that have a mold for back frame that is of a simple structure and can reduce the expenditure for mold of back frame, and can also save the material used for back frame so as to lower down the cost of flat panel display device.

Embodiments of the present invention have been described, but are not intending to impose any undue constraint to the appended claims of the present invention. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A backlight system of a flat panel display device, wherein:
    the backlight system comprises a back frame and a circuit board;
    the back frame comprises primary assembling pieces and secondary assembling pieces;
    the primary assembling pieces are of a number of at least two, the at least two primary assembling pieces being joined to each other to form a connection therebetween;
    the secondary assembling pieces are arranged inside the back frame and joined to the back frame; and a rack is mounted to at least one of the assembling pieces to receive the circuit board mounted thereto in such a way that the circuit board is releasably mounted to the back frame, wherein the rack comprises a first bridge and a second bridge that are mounted, in parallel to each other, to the assembling pieces, each of the bridges having a side that is adjacent to the other bridge and is provided with two retention pawls projecting toward a front surface or a back surface of the back frame, each of the retention pawls comprising an extension arm extending from a side of the bridge and a hook formed by bending an end of the extension arm, the four extension arms collectively delimiting an installation trough having a trough wall structure, the circuit board being received in the installation trough, the four hooks forming a support structure on the bottom of the installation trough; and the trough wall structure comprises four trough walls that are provided at the same side with notches for engaging the circuit board, the circuit board having a side forming, at positions corresponding to the notches, projections for engaging the notches; and a spring plate is arranged on a trough wall opposite to the notches, the spring plate applying a force in a direction opposite to the notches to a corresponding edge of the circuit board so at to releasably retain the circuit board in the installation trough.

2. The backlight system as claimed in claim 1, wherein:
the spring plate projects from a side edge of one of the bridges and has an end forming a hook.

3. The backlight system as claimed in claim 1, wherein:
the at least two primary assembling pieces comprise first and second primary assembling pieces that are joined to each other, in which the first primary assembling piece has an end having a surface forming at least two joint sections that are arranged to space from each other in a lengthwise direction of the first primary assembling piece, the first primary assembling piece using one of the joint sections to join a corresponding end of the second primary assembling piece.

4. The backlight system as claimed in claim 3, wherein:
the joint sections comprise recesses formed in a surface of the first primary assembling piece and having a shape corresponding to the end of the second primary assembling piece for receiving the end of the second primary assembling piece.

5. The backlight system as claimed in claim 4, wherein:
the recess of the first primary assembling piece forms in a bottom thereof a first through hole, the second primary assembling piece forming in a corresponding location a second through hole, the back frame comprising a fastener, the fastener extending through the first through hole and the second through hole to join the first primary assembling piece and the second primary assembling piece to each other.

6. The backlight system as claimed in claim 3, wherein:
the joint sections comprise recesses formed in a surface of the first primary assembling piece, the second primary assembling piece having an end having a surface forming, at corresponding locations, protrusions that are arranged to space from each other in a lengthwise direction of the second primary assembling piece, the protrusions being receivable in the recesses to join the first primary assembling piece and the second primary assembling piece to each other.

7. The backlight system as claimed in claim 3, wherein:
the back frame comprises a third primary assembling piece and a fourth primary assembling piece; and the first primary assembling piece, the second primary assembling piece, the third primary assembling piece, and the fourth primary assembling piece are straight linear and are joined to each other in a leading end-to-tailing end manner to form a rectangular main frame structure enclosing the back frame.

8. The backlight system as claimed in claim 7, wherein:
the secondary assembling pieces comprise a first secondary assembling piece and a second secondary assembling piece, the first secondary assembling piece having two ends respectively joined to at least two primary assembling pieces of the first primary assembling piece, the second primary assembling piece, the third primary assembling piece, and the fourth primary assembling piece, the second secondary assembling piece having two ends respectively joined to at least two primary assembling pieces of the first primary assembling piece, the second primary assembling piece, the third primary assembling piece, and the fourth primary assembling piece.

9. The backlight system as claimed in claim 8, wherein:
the two ends of the first secondary assembling piece are respectively joined to the first primary assembling piece and the second primary assembling piece that are adjacent to each other and the two ends of the second secondary assembling piece are respectively joined to the third primary assembling piece and the fourth primary assembling piece that are adjacent to each other; or the two ends of the first secondary assembling piece are respectively joined to the first primary assembling piece and the third primary assembling piece that are opposite to each other and the two ends of the second secondary assembling piece are respectively joined to the first primary assembling piece and the third primary assembling piece that are opposite to each other, and the second primary assembling piece, the fourth primary assembling piece, the first secondary assembling piece, and the second secondary assembling piece are arranged parallel to each other.

10. The backlight system as claimed in claim 8, wherein:
the back frame comprises at least one bracing piece, which is releasably fixed to one or more of the first primary assembling piece, the second primary assembling piece, the third primary assembling piece, the fourth primary assembling piece, the first secondary assembling piece, and the second secondary assembling piece, the bracing piece forming a bump.

11. A method for making a backlight system of a flat panel display device, wherein:
manufacturing primary assembling pieces and secondary assembling pieces of a back frame, the primary assembling pieces having a number of at least two;

joining at least two primary assembling pieces to form a main frame structure of the back frame;

joining the secondary assembling pieces inside the main frame structure; and releasably mounting a circuit board to the back frame via a rack, which is mounted to at least one of the assembling pieces to receive the circuit board mounted thereto in such a way that the circuit board is releasably mounted to the back frame, wherein the rack comprises a first bridge and a second bridge that are mounted, in parallel to each other, to the assembling pieces, each of the bridges having a side that is adjacent to the other bridge and is provided with two retention pawls projecting toward a front surface or a back surface of the back frame, each of the retention pawls comprising an extension arm extending from a side of the bridge and a hook formed by bending an end of the extension arm, four extension arms collectively delimiting an installation trough having a trough wall structure, the circuit board being received in the installation trough, the four hooks forming a support structure on the bottom of the installation trough; and wherein the trough wall structure comprises four trough walls that are provided at the same side with notches for engaging the circuit board, the circuit board having a side forming, at positions corresponding to the notches, projections for engaging the notches; and a spring plate is arranged on a trough wall opposite to the notches, the spring plate applying a force in a direction opposite to the notches to a corresponding edge of the circuit board so at to releasably retain the circuit board in the installation trough.

12. The method as claimed in claim 11, wherein:

the step of manufacturing primary assembling pieces of a back frame comprises: manufacturing at least first and second primary assembling pieces, in which the first primary assembling piece has an end forming at least two joint sections, each of the joint sections having a structure that mates a corresponding end of the second primary assembling piece; and the step of joining at least two primary assembling pieces to form a main frame structure of the back frame comprises: selecting one joint section of the at least two joint sections according to a size of the back frame to join the corresponding end of the second primary assembling piece.

13. The method as claimed in claim 12, wherein when an additional joint section is present between joining location of the second primary assembling piece and the end of the first primary assembling piece, before or after the step of selecting one joint section of the at least two joint sections according to a size of the back frame to join the corresponding end of the second primary assembling piece, the additional joint section of the first primary assembling piece that is located outward of the joining position of the second primary assembling piece is trimmed off.

* * * * *